United States Patent
Yoshida et al.

(10) Patent No.: US 10,395,956 B2
(45) Date of Patent: Aug. 27, 2019

(54) SUBSTRATE TRANSFER APPARATUS AND METHOD OF TEACHING SUBSTRATE TRANSFER ROBOT

(71) Applicant: KAWASAKI JUKOGYO KABUSHIKI KAISHA, Kobe-shi, Hyogo (JP)

(72) Inventors: Masaya Yoshida, Himeji (JP); Hiroyuki Okada, Kakogawa (JP); Takayuki Fukushima, Takarazuka (JP); Hirohiko Goto, Akashi (JP)

(73) Assignee: KAWASASKI JUKOGYO KABUSHIKI KAISHA, Kobe-shi (JP)

( * ) Notice: Subject to any disclaimer, the term of this patent is extended or adjusted under 35 U.S.C. 154(b) by 0 days.

(21) Appl. No.: 16/082,213

(22) PCT Filed: Feb. 28, 2017

(86) PCT No.: PCT/JP2017/007882
§ 371 (c)(1),
(2) Date: Sep. 4, 2018

(87) PCT Pub. No.: WO2017/150551
PCT Pub. Date: Sep. 8, 2017

(65) Prior Publication Data
US 2019/0181027 A1     Jun. 13, 2019

Related U.S. Application Data (60) Provisional application No. 62/303,765, filed on Mar. 4, 2016.

(51) Int. Cl.
*H01L 21/67* (2006.01)
*H01L 21/68* (2006.01)
(Continued)

(52) U.S. Cl.
CPC ........ *H01L 21/67259* (2013.01); *B65G 47/90* (2013.01); *H01L 21/67706* (2013.01);
(Continued)

(58) Field of Classification Search
CPC .. H01L 21/67259; H01L 21/681; H01L 21/68
See application file for complete search history.

(56) References Cited

U.S. PATENT DOCUMENTS 5,981,966 A * 11/1999 Honma ............. H01L 21/67778
                                                                 250/559.33
7,105,847 B2 * 9/2006 Oka .................. H01L 21/67265
                                                                 250/559.29
(Continued)

FOREIGN PATENT DOCUMENTS

JP      2002-009135 A     1/2002
JP      2010-219209 A     9/2010
(Continued)

*Primary Examiner* — Thomas Randazzo
(74) *Attorney, Agent, or Firm* — Oliff PLC (57) ABSTRACT

A controller: selects one optical sensor to use from among a first optical sensor and at least one second optical sensor; moves a substrate transfer hand to a detection start position at which an optical path of the selected optical sensor is positioned above a substrate placing portion and does not interfere with a pillar portion; lowers the substrate transfer hand from the detection start position to a detection position at which an object is detected by the optical sensor; and stores, as a height position of the substrate placing portion, a height of the optical path of the optical sensor from a predetermined positional reference when the substrate transfer hand is at the detection position.

6 Claims, 4 Drawing Sheets

(51) Int. Cl.
*H01L 21/677* (2006.01)
*H01L 21/687* (2006.01)
*B65G 47/90* (2006.01)

(52) U.S. Cl.
CPC ............ *H01L 21/68* (2013.01); *H01L 21/681* (2013.01); *H01L 21/68707* (2013.01); *B65G 2203/041* (2013.01)

(56) References Cited

U.S. PATENT DOCUMENTS

| | | | | |
|---|---|---|---|---|
| 2002/0002422 | A1* | 1/2002 | Kondo | H01L 21/67259 700/228 |
| 2004/0012363 | A1* | 1/2004 | Simondet | B25J 9/1692 318/568.21 |
| 2007/0065144 | A1* | 3/2007 | Hofmeister | H01L 21/67259 396/611 |
| 2011/0130864 | A1 | 6/2011 | Hirota | |
| 2014/0107825 | A1* | 4/2014 | Kubodera | G05B 19/4189 700/112 |

FOREIGN PATENT DOCUMENTS

| | | | |
|---|---|---|---|
| JP | 2010-284728 A | 12/2010 | |
| WO | 2009/145082 A1 | 12/2009 | |
| WO | WO-2009145082 A1 * | 12/2009 | ............ B25J 9/1692 |

* cited by examiner

SUBSTRATE TRANSFER APPARATUS AND METHOD OF TEACHING SUBSTRATE TRANSFER ROBOT

TECHNICAL FIELD

The present invention relates to a technique of transferring a substrate, such as a semiconductor substrate or a glass substrate.

BACKGROUND ART

Conventionally, substrate transfer robots have been used for transferring a substrate, such as a semiconductor substrate or a glass substrate. Generally speaking, such a substrate transfer robot includes: a robot arm; a substrate transfer hand attached to the hand end of the robot arm; and a controller. The substrate transfer hand includes a substrate holder for holding a substrate. The substrate can be held by, for example, suction or gripping. Patent Literature 1 describes, as one example, a substrate transfer hand including a plate-shaped blade whose distal end is branched to be Y-shaped. The substrate transfer hand transfers a substrate, with the substrate placed on the blade.

There is a case where the above substrate transfer hand including the Y-shaped blade includes a transmissive optical sensor that is formed by a light emitter and a light receiver. The light emitter is provided on one of the Y-shaped branched distal end portions, and the light receiver is provided on the other distal end portion in a manner to face the light emitter. The presence or absence of a substrate is detected by the transmissive optical sensor. For example, the substrate transfer apparatus described in Patent Literature 1 is configured as follows. The Y-shaped branched distal end portions of the blade are provided with respective sensor supports. A first transmissive optical sensor used for detecting the presence or absence of a substrate and the orientation of the substrate is mounted on the front end side of the sensor supports, and a second transmissive optical sensor used for detecting displacement of the substrate is mounted on the rear end side of the sensor supports.

CITATION LIST

Patent Literature

PTL 1: Japanese Laid-Open Patent Application Publication No. 2010-219209

SUMMARY OF INVENTION

Technical Problem

In some cases, a substrate handover apparatus, on which a substrate is to be temporarily placed, is provided at a handover position of a substrate transferred by the substrate transfer robot. For example, the substrate handover apparatus includes three or more substrate placing portions, and is configured to support the edge of a circular substrate by the substrate placing portions from below.

In the substrate handover apparatus, the plurality of substrate placing portions (i.e., portions that come into contact with the substrate) are positioned at the same height. Accordingly, when the substrate is supported by the substrate handover apparatus, the substrate is in a horizontal orientation. It should be noted that a substrate W being in a horizontal orientation herein means that the main surface of the substrate W extends horizontally. However, there is a case where the plurality of substrate placing portions are not positioned at the same height due to an assembling error or machining error. When the substrate is supported by such a plurality of substrate placing portions, the substrate is tilted from the horizontal orientation. In a case where the substrate is tilted from the horizontal orientation unexpectedly, the substrate transfer hand may interfere with the substrate when the substrate transfer robot approaches to reach the substrate.

In order to solve the above problem of interference, the height positions of the plurality of substrate placing portions may be taught to the substrate transfer robot in advance, which allows the substrate transfer robot to estimate a tilt of the substrate supported by the plurality of substrate placing portions and to move the substrate transfer hand in a manner to avoid the interference with the substrate. Conventionally, teaching the positions of the substrate placing portions to the substrate transfer robot is performed by an operator in the following manner. By using a teach pendant, the operator operates the substrate transfer robot to move the substrate transfer hand to the substrate placing portions, and causes the robot to store the positions of the substrate placing portions. However, this teaching work is significantly onerous for the operator since the operator needs to operate the teach pendant little by little while visually checking the position of the substrate transfer hand in relation to the substrate placing portions.

The present invention has been made in view of the above. The present invention proposes a technique of automatically teaching the heights of the substrate placing portions to the substrate transfer robot.

Solution to Problem

If the automatic teaching of the height positions of the substrate placing portions to the substrate transfer robot can be achieved mainly by making changes and/or additions to a program without adding new components, the above-described problems can be solved while suppressing cost increase. In this respect, the inventors of the present invention have come up with utilizing mapping sensor technology, which is conventionally adopted in substrate transfer robots, for automatically teaching the height positions of the substrate placing portions to the substrate transfer robot. It should be noted that a mapping sensor is an optical sensor for detecting the presence or absence of and the number of substrates.

A substrate transfer apparatus according to one aspect of the present invention includes: a plurality of substrate supports arranged on a same circumference; and a robot including an arm, a substrate transfer hand provided on a distal end portion of the arm, and a controller configured to control operation of the arm and the substrate transfer hand. Each of the substrate supports includes: a substrate placing portion that includes an upper surface on which an edge of a substrate is placed; and a pillar portion that supports the substrate placing portion at a position outward of the substrate placing portion in a radial direction of the circumference. The substrate transfer hand includes: a blade whose distal end side is branched into two portions that are a first end portion and a second end portion and between which each substrate support is insertable from the distal end side; a first optical sensor configured to detect an object that blocks a first optical path, the first optical path connecting the first end portion and the second end portion and being orthogonal to an axial direction of the substrate transfer hand; and at least one second optical sensor configured to detect an object that blocks a second optical path, the second optical path connecting the first end portion and the second end portion and being inclined relative to the first optical path. The controller: selects one optical sensor to use from among the first optical sensor and the at least one second optical sensor; moves the substrate transfer hand to a detection start position at which the optical path of the selected optical sensor is positioned above the substrate placing portion and does not interfere with the pillar portion; lowers the substrate transfer hand from the detection start position to a detection position at which an object is detected by the optical sensor; and stores, as a height position of the substrate placing portion, a height of the optical path of the optical sensor from a predetermined positional reference when the substrate transfer hand is at the detection position.

A method of teaching a substrate transfer robot according to another aspect of the present invention is a method of teaching height positions of a plurality of substrate placing portions arranged on a same circumference to a substrate transfer robot that includes an arm and a substrate transfer hand provided on a distal end portion of the arm. Each of the substrate placing portions includes an upper surface on which an edge of a substrate is placed, and is supported by a pillar portion at a position outward of the substrate placing portion in a radial direction of the circumference. The substrate transfer hand includes: a blade whose distal end side is branded into two portions that are a first end portion and a second end portion and between which each substrate placing portion is insertable from the distal end side; first optical sensor configured to detect an object that blocks a first optical path, the first optical path connecting the first end portion and the second end portion and being orthogonal to an axial direction of the substrate transfer hand; and at least one second optical sensor configured to detect an object that blocks a second optical path, the second optical path connecting the first end portion and the second end portion and being inclined relative to the first optical path. The method of teaching a substrate transfer robot includes: selecting an optical sensor to use from among the first optical sensor and the at least one second optical sensor based on a position of the substrate placing portion relative to a base axis of the arm; moving the substrate transfer band to a detection start position at which the optical path of the selected optical sensor is positioned above the substrate placing portion and does not interfere with the pillar portion; lowering the substrate transfer hand from the detection start position to a detection position at which an object is detected by the optical sensor; and storing, as a height position of the substrate placing portion, a height of the optical path of the optical sensor from a predetermined positional reference when the substrate transfer hand is at the detection position.

According to the above substrate transfer apparatus and the above method of teaching a substrate transfer robot, the height position of the substrate placing portion, on which the substrate is placed, can be automatically taught to the substrate transfer robot by utilizing technology that is conventionally adopted in substrate transfer robots. The substrate transfer hand includes a plurality of optical sensors, and utilizes an optical sensor selected from among the plurality of optical sensors. This makes it possible to readily pass only the substrate placing portion across the optical path of the optical sensor while preventing the substrate transfer hand from interfering with the pillar portion.

A substrate transfer apparatus according to yet another aspect of the present invention includes: a plurality of substrate supports, each of which includes a substrate placing portion and a pillar portion, the substrate placing portion including an upper surface on which an edge of a substrate is placed, the pillar portion being higher than the substrate placing, portion; and a substrate transfer robot including an arm, a substrate transfer hand rotatably coupled to the arm, and a controller configured to control operation of the arm and the substrate transfer hand. The substrate transfer hand includes: a blade whose distal end side is branched into two portions that are a first end portion and a second end portion; and an optical sensor configured to detect an object that blocks an optical path connecting the first end portion and the second end portion. The optical path is inclined relative to a direction that is orthogonal to an axial direction of the substrate transfer hand when seen in a direction perpendicular to a main surface of the blade. The controller: moves the substrate transfer hand to a detection start position at which the optical path of the optical sensor is positioned above the substrate placing portion and does not interfere with the pillar portion; lowers the substrate transfer hand from the detection start position to a detection position at which an object is detected by the optical sensor; and stores, as a height position of the substrate placing portion, a height of the optical path of the optical sensor from a predetermined positional reference when the substrate transfer hand is at the detection position.

According to the above substrate transfer apparatus, the height position of the substrate placing portion, on which the substrate is placed, can be automatically taught to the substrate transfer robot by utilizing technology that is conventionally adopted in substrate transfer robots. The substrate transfer hand includes the optical sensor whose optical path is inclined relative to a direction that is orthogonal to a direction connecting the rotational axis of the hand and the center of the substrate held by the hand. This makes it possible to readily pass only the substrate placing portion across the optical path of the optical sensor while preventing the substrate transfer hand from interfering with the pillar portion.

Advantageous Effects of Invention

The present invention makes it possible to automatically teach the height positions of the substrate placing portions, on which the substrate is placed, to the substrate transfer robot.

BRIEF DESCRIPTION OF DRAWINGS

FIG. 5 is a side view showing the substrate transfer hand positioned at a detection position P2.

DESCRIPTION OF EMBODIMENTS

[Schematic Configuration of Substrate Transfer Apparatus 10]

Figure 1:
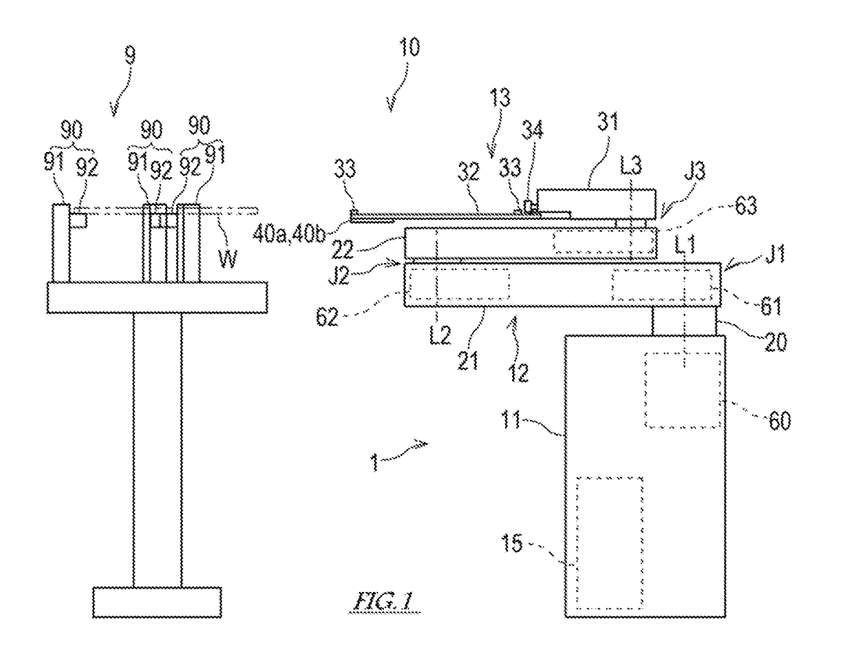
FIG. 1 is a schematic plan view showing an overall configuration of a substrate transfer apparatus according to one embodiment of the present invention.
Figure 2:
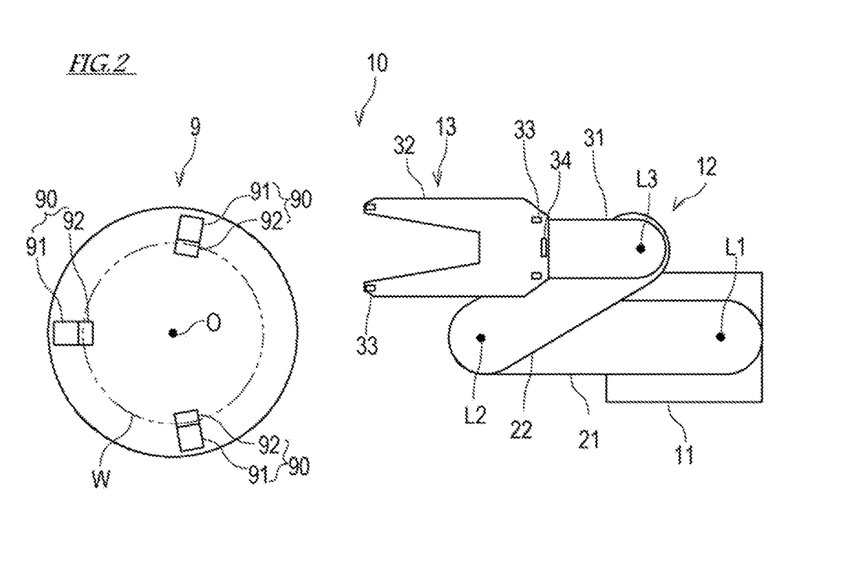
FIG. 2 is a schematic side view of the substrate transfer apparatus.

Next, one embodiment of the present invention is described with reference to the drawings. FIG. 1 shows a substrate transfer apparatus 10 according to one embodiment of the present invention. FIG. 2 is a schematic side view of the substrate transfer apparatus 10. The substrate transfer apparatus 10 shown in FIG. 1 and FIG. 2 includes a substrate handover apparatus 9 and a substrate transfer robot 1. The substrate transfer apparatus 10 is applicable to various systems for transferring a substrate W, such as an EFEM (Equipment Front End Module), a sorter, and a substrate processing system.

[Configuration of Substrate Handover Apparatus 9]

The substrate handover apparatus 9 according to the present embodiment includes a plurality of, specifically three or more, substrate supports 90 arranged on the same circumference. In the description below, the center of the circumference formed by the plurality of substrate supports 90 is referred to as "the center O" of the substrate handover apparatus 9.

Each substrate support 90 includes a pillar portion 91 and a substrate placing portion 92. The pillar portion 91 extends in the vertical direction, and the substrate placing portion 92 includes an upper surface that supports the edge of the substrate W from below. The pillar portion 91 is disposed outward of the substrate placing portion 92 in the radial direction of the circumference formed by the plurality of substrate supports 90. The height of the pillar portion 91 is different front the height of the substrate placing portion 92. Normally, the height of the pillar portion 91 is greater than the height of the substrate placing portion 92. In the present embodiment, each pillar portion 91 supports one substrate placing portion 92. However, as an alternative, each pillar portion 91 may support a plurality of substrate placing portions 92 arranged at regular intervals in the up-down direction.

The substrate placing portion 92 according to the present embodiment is a protrusion that protrudes horizontally from the pillar portion 91 toward the center O of the substrate handover apparatus 9. However, the configuration of the substrate placing portion 92 is not limited to this example. Substrate placing portions 92 in various forms are adoptable. For example, the substrate placing portion 92 may be a horizontal groove formed in the pillar portion 91, or a may be a plate-shaped or bar-shaped protrusion protruding horizontally from the pillar portion 91.

Desirably, the height positions of the plurality of substrate placing portions 92 are the same as each other so that the substrate W placed on the substrate handover apparatus 9 will be in a horizontal orientation. However, there is a case where the substrate placing portions 92 of the substrate handover apparatus 9 are not positioned at the same height due to, for example, an assembling error or machining error. Therefore, the substrate transfer apparatus 10 performs a process of teaching the height positions of the substrate placing portions 92 to the substrate transfer robot 1. This teaching process will be described below.

[Configuration of Substrate Transfer Robot 1]

The substrate transfer robot 1 includes: a base 11; a robot arm (hereinafter, "arm 12") supported by the base 11; a substrate transfer hand (hereinafter, "hand 13") coupled to a hand end portion of the arm 12; and a controller 15 configured to control the operation of the arm 12 and the hand 13.

The arm 12 according to the present embodiment is a horizontal articulated manipulator, in which a plurality of links are coupled to each other via vertical rotational axes. The arm 12 includes: a lifting/lowering shaft 20 provided upright on the base 11; a first link 21 coupled to the lifting/lowering shaft 20 via a first joint J1; and a second link 22 coupled to the distal end portion of the first link 21 via a second joint J2. The hand 13 is coupled to the distal end portion of the second link 22 via a third joint J3.

A first axis L1 is the rotational axis of the first joint J1. A second axis L2 is the rotational axis of the second joint J2. A third axis L3 is the rotational axis of the third joint J3. The direction in which each of these axes extends is substantially the vertical direction. In the description below, the first axis L1 is also referred to as "the base axis" of the arm 12.

The hand 13 includes: a base portion 31 coupled to the hand end portion of the arm 12; and a blade 32 fixed to the base portion 31. The base portion 31 is rotatably coupled to the arm 12, such that the base portion 31 is rotatable about the rotational axis (third axis L3) perpendicular to the main surface of the blade 32. The blade 32 is a Y-shaped (or U-shaped) thin plate member whose distal end is brandied into two distal end portions. In the present embodiment, the main surface of the blade 32 extends horizontally, and a plurality of support pads 33 supporting the substrate W are provided on the upper surface of the blade 32. The plurality of support pads 33 are arranged such that when the substrate W is placed on the blade 32, the peripheral edge of the substrate W contacts with the plurality of support pads 33. The hand 13 is provided with a pusher 34, which is positioned on the proximal end side of the blade 32. The substrate W placed on the blade 32 is gripped between the pusher 34 and the support pads 33 disposed on the distal end portions of the blade 32.

The hand 13 according to the present embodiment is configured to hold and transfer the substrate W in a horizontal orientation. However, as an alternative, the hand 13 may be configured to be able to hold the substrate W in a vertical orientation. The hand 13 according to the present embodiment holds the substrate W by gripping the edge thereof. However, as an alternative, the hand 13 may hold the substrate W not by edge gripping but by a different known holding method, such as by suction, dropping-in, or placing-on.

Figure 3:
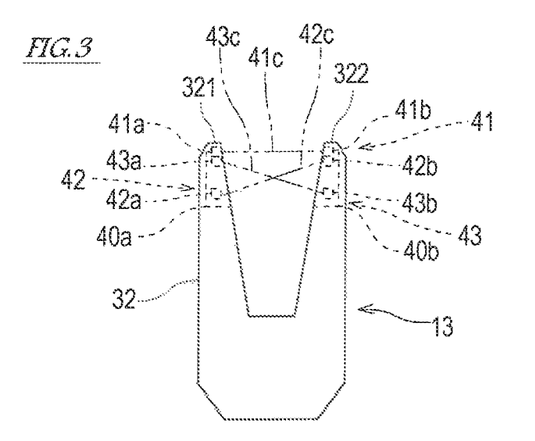
FIG. 3 is a plan view of a substrate transfer hand.

FIG. 3 is a plan view of the blade 32 of the hand 13. As shown in FIG. 3, the two branched distal end portions of the blade 32 (i.e., a first end portion 321 and a second end portion 322) are sufficiently spaced apart from each other so that the substrate support 90 can be inserted between them from the distal end side. A pair of sensor supports 40a and 40b is provided on the back surfaces of the first end portion 321 and the second end portion 322, respectively. The sensor supports 40a and 40h are spaced apart from each other in a direction parallel to the main surface of the blade 32 (i.e., in the horizontal direction)

The pair of sensor supports 40a and 40b according to the present embodiment is provided with three optical sensors 41, 42, and 43. In the present embodiment, all of the three optical sensors 41, 42, and 43 are transmissive optical sensors, each of which is capable of detecting an object that blocks an optical path. However, as an alternative, the optical sensors 41, 42, and 43 may be reflective optical sensors each configured to emit light parallel to the main surface of the blade 32.

The first optical sensor 41 is formed by the combination of a light emitter 41a and a light receiver 41b. The light emitter 41a is provided on the distal end portion of the sensor support 40a, which is one of the pair of sensor supports 40a and 40b. The light receiver 41b is provided on the distal end portion of the other sensor support 40b. The light emitter 41a includes a light source configured to emit light that serves as a detection medium. The light receiver 41b includes a photodetector configured to receive the light emitted from the light emitter 41a and convert it into an electrical signal. The light emitter 41a and the light receiver 41b are arranged facing each other. The light emitted from the light emitter 41a travels straight, and is incident on a light entrance window of the light receiver 41b. FIG. 3 shows, by a chain line, the optical path (first optical path 41c) of the light emitted from the light emitter 41a. If the first optical sensor 41 detects a decrease in the amount of light incident on the light receiver 41b, the decrease being caused as a result of an object passing across the optical path 41c, then the first optical sensor 41 outputs an object detection signal to the controller 15.

The hand 13 according to the present embodiment includes two second optical sensors 42 and 43. Hereinafter, for the sake of convenience of the description, the second optical sensor 42 on the left, which is one of the two second optical sensors 42 and 43, is referred to as "left second optical sensor 42", and the other second optical sensor 43 is referred to as "right second optical sensor 43". It is desirable for the hand 13 to include the two second optical sensors 42 and 43 as in the present embodiment. However, as an alternative, the hand 13 may include only one of the two second optical sensors 42 and 43.

The left second optical sensor 42 is formed by the combination of a light emitter 42a and a light receiver 42b. The light emitter 42a is provided on the distal end portion of the sensor support 40a, which is one of the pair of sensor supports 40a and 40b. The light receiver 42b is provided on the distal end portion of the other sensor support 40b. Similarly, the right second optical sensor 43 is formed by the combination of a light emitter 43a and a light receiver 43b. The light emitter 43a is provided on the distal end portion of the sensor support 40a, which is one of the pair of sensor supports 40a and 40b. The light receiver 43b is provided on the distal end portion of the other sensor support 40b. The configuration of each of the left second optical sensor 42 and the right second optical sensor 43 is substantially the same as the configuration of the first optical sensor 41. Therefore, the description of the details of the configuration of each of the left second optical sensor 42 and the right second optical sensor 43 is omitted herein.

FIG. 3 shows, by chain lines, the optical path of the left second optical sensor 42 (left second optical path 42c) and the optical path of the right second optical sensor 43 (right second optical path 43c). The first optical path 41c, the left second optical path 42c, and the right second optical path 43c are substantially parallel to the main surface of the blade 32 (i.e., substantially horizontal), and connect the first end portion 321 and the second end portion 322 of the blade 32. The first optical path 41c is substantially parallel to a straight line that connects the distal end portions of the blade 32, and is orthogonal to the axial direction of the hand 13. It should be noted that the axial direction of the hand 13 is a direction that connects the proximal end portion and the distal end portion of the hand 13. To be more specific, the axial direction of the hand 13 is a direction connecting the rotational axis (third axis L3) of the hand 13 and the center of the substrate W held by the hand 13.

The left second optical path 42c and the right second optical path 43c are in a plane parallel to the main surface of the blade 32 (i.e., a horizontal plane), and are inclined relative to the first optical path 41c. In other words, when seen in a direction perpendicular to the main surface of the blade 32, the optical paths 42c and 43c of the second optical sensors 42 and 43 are inclined relative to a direction that is orthogonal to the axial direction of the hand 13. The inclination of the left second optical path 42c relative to the first optical path 41c and the inclination of the right second optical path 43c relative to the first optical path 41e are inverted with respect to each other. The left second optical path 42c and the right second optical path 43c cross each other. In the present embodiment, the left second optical path 42c is inclined such that its distance from the first optical path 41c gradually increases from the right side to the left side of the plane of FIG. 3. On the other hand, the right second optical path 43c is inclined such that its distance from the first optical path 41c gradually decreases from the right side to the left side of the plane of FIG. 3. As a result, the directions in which the first optical path 41c, the left second optical path 42c, and the right second optical path 43e extend (i.e., the optical axis directions of the first optical path 41c, the left second optical path 42c, and the right second optical path 43c) are different from each other.

Figure 4:
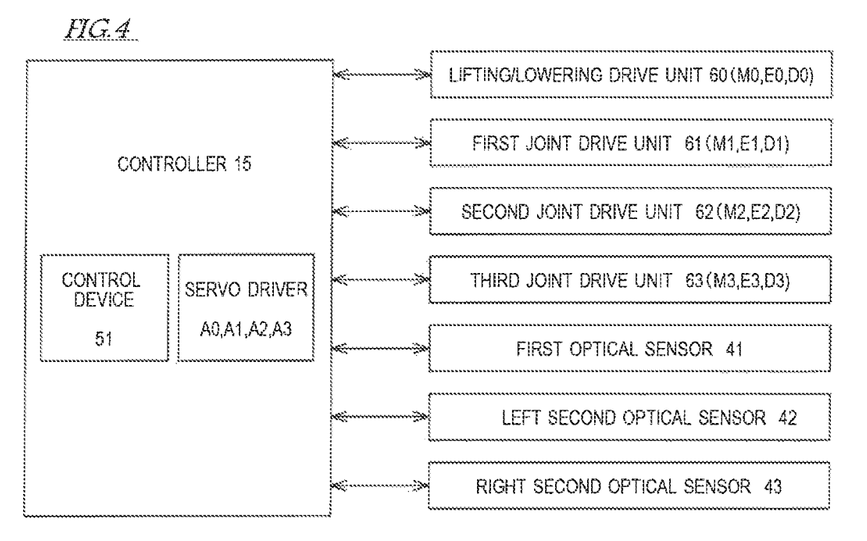
FIG. 4 is a block diagram showing a control system configuration of the substrate transfer apparatus.

FIG. 4 shows a control system configuration of the substrate transfer robot 1. As shown in FIG. 2 and FIG. 4, the lifting/lowering shaft 20 is driven by a lifting/lowering drive unit 60 to be lifted/lowered or to expand/contract substantially in the vertical direction. The lifting/lowering drive unit 60 includes, for example, a servomotor M0, a position detector E0, and a power transmission mechanism (not shown) configured to transmit the motive power of the servomotor M0 to the lifting/lowering shaft 20.

The first to third joints J1 to J3 are provided with first to third joint drive units 61 to 63, respectively. The first to third joint drive units 61 to 63 cause the respective joints J1 to J3 to rotate about their rotational axes. The joint drive units 61 to 63 include, for example, servomotors M1 to M3, position detectors E1 to E3, and power transmission mechanisms (not shown) configured to transmit the motive power of the servomotors M1 to M3 to the corresponding links. Each of the power transmission mechanisms is, for example, a gear power transmission mechanism including a gear reducer. Each of the position detectors E0 to E3 is configured as a rotary encoder, for example. The servomotors M0 to M3 can be driven independently of each other. When the servomotors M0 to M3 are driven, the position detectors E0 to E3 detect rotational positions of the output shafts of the respective servomotors M0 to M3.

The operation of the arm 12 and the hand 13 is controlled by the controller 15. As shown in FIG. 4, the controller 15 includes a control device 51 and servo drivers A0 to A3 corresponding to the respective servomotors M0 to M3. The controller 15 performs servo control of moving the hand 13 mounted on the wrist of the arm 12 along an intended path to place the hand 13 in an intended pose (i.e., place the hand 13 in an intended position and orientation in space).

The control device 51 is a computer that includes, for example, an arithmetic processing device (a processor), such as a microcontroller, CPU, MPU, PLC, DSP, ASIC, or FPGA, and a storage device, such as a ROM and RAM (all of these devices are not shown). Programs executed by the arithmetic processing device, various fixed data, etc., are stored in the storage device. The programs stored in the storage device include a teaching program according to the present embodiment. In addition, teaching point data for controlling the operation of the arm 12, data regarding the shape and dimensions of the hand 13, data regarding the shape and dimensions of the substrate W held by the hand 13, and so forth are stored in the storage device.

The control device 51 performs processes for controlling the operation of the substrate transfer robot 1 by reading out and executing software, such as the programs stored in the storage device, by the arithmetic processing device. It should be noted that the control device 51 may be configured as a single computer performing the processes by centralized control, or may be configured as a plurality of computers performing distributed control in cooperation with each other, thereby performing the processes.

The control device 51 calculates a target pose, which is an intended pose of the hand 13 after the elapse of a predetermined control time, based on: the pose of the hand 13 corresponding to the rotational positions detected by the respective position detectors E0 to E3; and the teaching point data stored in the storage device. The control device 51 outputs a control command (position command) to each of the servo drivers A0 to A3, such that the hand 13 is placed in the target pose after the predetermined control time has elapsed. Each of the servo drivers A0 to A3 supplies driving electric power to a corresponding one of the servomotors M0 to M3 based on the control command. With this configuration, the hand 13 can be moved and placed in the intended pose.

[Teaching of Height Position of Substrate Placing Portion 92]

Hereinafter, the process of teaching the height positions of the substrate placing portions 92 to the substrate transfer robot 1 is described. It should be noted that the controller 15 (more specifically, the control device 51) reads out and executes a prestored predetermined program, thereby performing the process of teaching the height positions of the substrate placing portions 92 to the substrate transfer robot 1 as described below.

Figure 5:
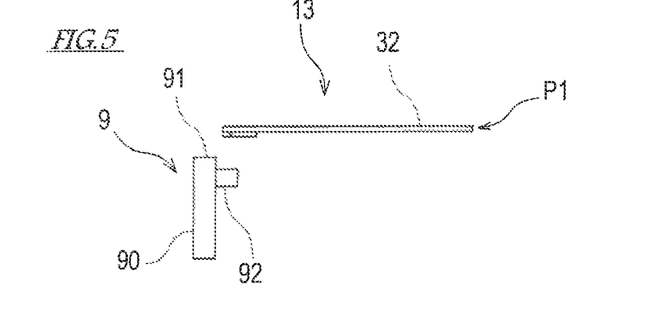
FIG. 5 is a side view showing the substrate transfer hand positioned at a detection start position P1.

The controller 15 is given the coordinates of each substrate placing portion 92 in advance. FIG. 5 is a side view showing the hand 13 positioned at a detection start position P1. As shown in FIG. 5, first, the controller 15 operates the arm 12 and the hand 13 to move the hand 13 to the detection start position P1. When the hand 13 is at the detection start position P1, a selected one of the optical sensors 41, 42, and 43 is used. Also, when the hand 13 is at the detection start position P1, the optical path 41c, 42c, or 43c of the selected one of the optical sensors 41, 42, and 43 is above and away from a target substrate placing portion 92 by a predetermined distance. Further, when the hand 13 is at the detection start position P1, the hand 13 does not interfere with the pillar portion 91 of the substrate support 90.

Figure 6:
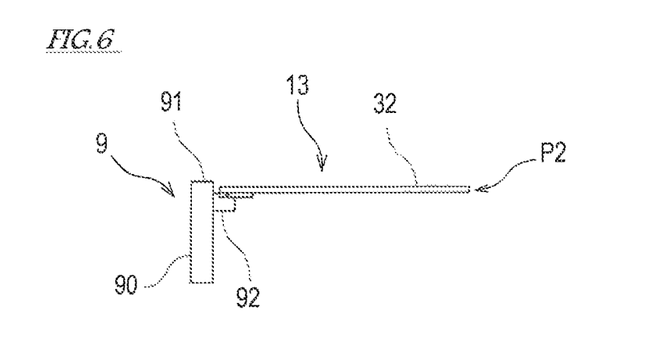

Next, the controller 15 operates the arm 12 such that the hand 13 at the detection start position P1 is lowered from the detection start position P1 to a detection position P2. FIG. 6 is a side view of the hand positioned at the detection position P2. As shown in FIG. 5 and FIG. 6, while the hand 13 is being lowered from the detection start position P1, the optical path 41c, 42c, or 43c becomes blocked by an object (i.e., the target substrate placing portion 92). Accordingly, an object detection signal is outputted to the controller 15 from one of the optical sensors 41, 42, and 43 corresponding to the blocked optical path 41c, 42c, or 43c. In the controller 15, the position of the hand 13 when the controller 15 has received the object detection. signal is defined as the detection position P2. Then, based on the rotational positions of the respective position detectors E0 to E3 when the hand 13 is at the detection position P2, the controller 15 determines and stores the height position of the optical path 41c, 42c, or 43c, i.e., the height position of the substrate placing portion 92, when the hand 13 is at the detection position P2. It should be noted that the height position of the substrate placing portion 92 may be a distance in the vertical direction from a predetermined positional reference on the substrate transfer robot 1 (for example, the predetermined positional reference is the height of the upper surface of the base 11).

In the above, the controller 15 can determine the height position of the substrate placing portion 92 based on the rotational positions of the position detectors E0 to E3 and the dimensions of the arm 12 and the hand 13, including the mounting positions of the optical sensors 41, 42, and 43 on the hand 13. Alternatively, a test piece may be provided at a known height from a predetermined reference height of the substrate transfer robot 1, and the controller 15 may perform a height detecting process using the test piece as a target to obtain the rotational positions of the position detectors E0 to E3. The controller 15 may compare the obtained rotational positions of the position detectors E0 to E3 with the rotational positions of the position detectors E0 to E3 obtained in the height detecting process of detecting the height of the substrate placing portion 92, thereby determining the height position of the substrate placing portion 92.

When performing the above teaching process, the optical sensor to use is selected from among the optical sensors 41, 42, and 43, and the pose of the hand 13 at the detection start position P1 is adjusted, so as to prevent the hand 13 from interfering with the non-target substrate placing portions 92 and the pillar portions 91 corresponding thereto. It should be noted that the optical sensor to use is selected from among the optical sensors 41, 42, and 43 based on the position of the target substrate placing portion 92 in a plan view relative to a straight line that connects the base axis L1 of the arm 12 and the center O of the substrate handover apparatus 9, specifically, based on whether the target substrate placing portion 92 is on one side or the other side of the straight line.

Figure 7:
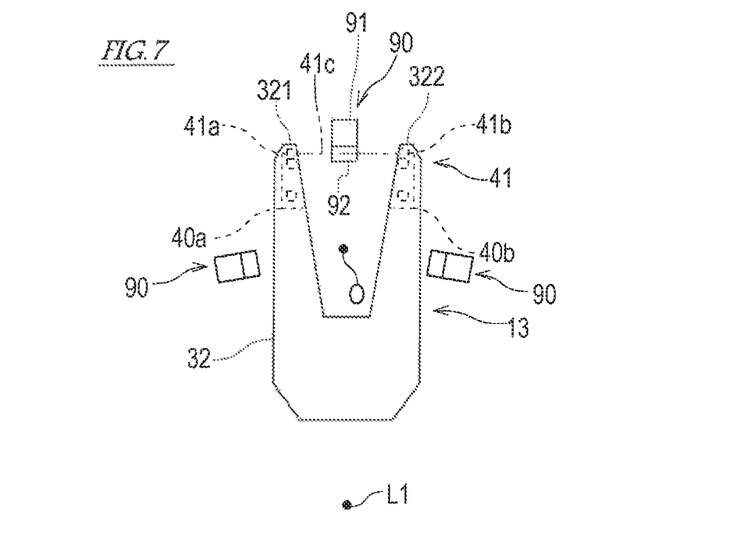
FIG. 7 is a plan view showing the substrate transfer hand in a case where a teaching process is performed by using a first optical sensor.

FIG. 7 is a plan view showing the hand 13 in a case where the teaching process is performed by using the first optical sensor 41. It should be noted that, in FIG. 7, the distance from the base axis L1 of the substrate transfer robot Ito the center O of the substrate handover apparatus 9 is shown in a shortened manner.

For example, as shown in FIG. 7, in a plan view, if the target substrate placing portion 92 is positioned roughly on the straight line that connects the base axis L1 of the arm 12 and the center O of the substrate handover apparatus 9, then the first optical sensor 41 is selected. In the case of performing the height position teaching process by using the first optical sensor 41, the hand 13 can be moved to the detection start position P1 corresponding to the target substrate placing portion 92 by passing the hand 13 between the non-target substrate placing portions 92 and the pillar portions 91 corresponding thereto.

Figure 8:
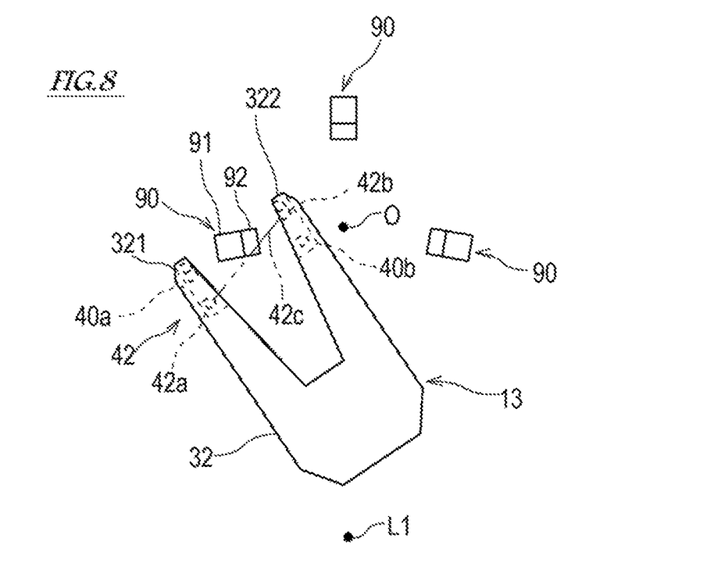
FIG. 8 is a plan view showing the substrate transfer hand in a case here a teaching process is performed by using a left second optical sensor.

FIG. 8 is a plan view showing the hand 13 in a case where the teaching process is performed by using the left second optical sensor 42. It should be noted that, in FIG. 8, the distance from the base axis L1 of the substrate transfer robot 1 to the center O of the substrate handover apparatus 9 is shown in a shortened manner.

For example, as shown in FIG. 8, in a plan view, if the target substrate placing portion 92 is positioned on the left side of the straight line that connects the base axis L1 of the arm 12 and the center O of the substrate handover apparatus 9, then the left second optical sensor 42 is selected. In the case of performing the height position teaching process by using the left second optical sensor 42, the hand 13 can be moved to the detection start position P1 corresponding to the target substrate placing portion 92 in such a manner as to insert one of the pair of sensor supports 40a and 40b of the hand 13 between the pillar portions 91.

Figure 9:
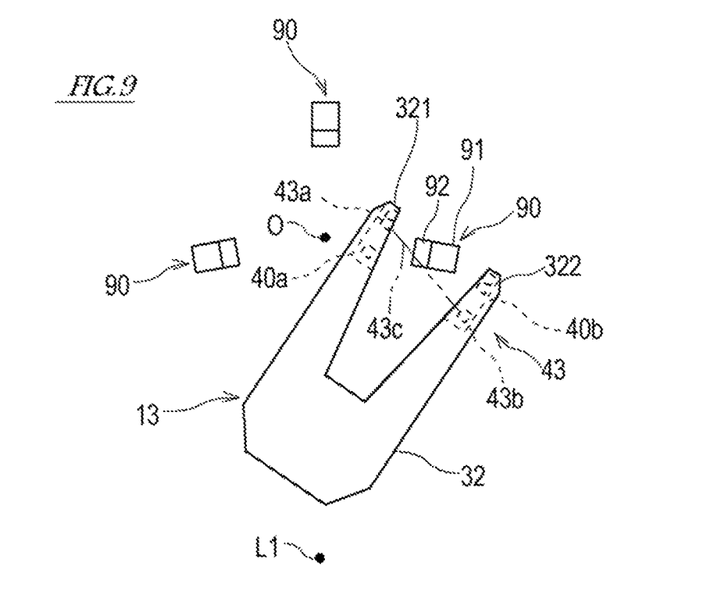
FIG. 9 is a plan view showing the substrate transfer hand in a case where a teaching process is performed by using a right second optical sensor.

FIG. 9 is a plan view showing the hand 13 in a case where the teaching process is performed by using the right second optical sensor 43. It should be noted that, in FIG. 9, the distance from the base axis L1 of the substrate transfer robot 1 to the center O of the substrate handover apparatus 9 is shown in a shortened manner.

For example, as shown in FIG. 9, in a plan view, if the target substrate placing portion 92 is positioned on the right side of the straight line that connects the base axis L1 of the arm 12 and the center O of the substrate handover apparatus 9, then the right second optical sensor 43 is selected. In the case of performing the height position teaching process by using the right second optical sensor 43, the hand 13 can be moved to the detection start position P1 corresponding to the target substrate placing portion 92 in such a manner as to insert one of the pair of sensor supports 40a and 40b of the hand 13 between the pillar portions 91. It should be noted that the one of the sensor supports 40a and 40h inserted between the pillar portions 91 is different between the case where the left second optical sensor 42 is used and the case where the right second optical sensor 43 is used.

As described above, one of the optical sensors 41, 42, and 43 that is to be used is selected based on the position of the target substrate placing portion 92 relative to the straight line that connects the base axis L1 of the arm 12 and the center O of the substrate handover apparatus 9. This makes it possible to readily prevent the hand 13 from interfering with the non-target substrate placing portions 92 and the pillar portions 91 corresponding thereto. For example, when seen from the center O of the substrate handover apparatus 9, even though the pillar portion 91 is present immediately outward of the substrate placing portion 92, the height position of the substrate placing portion 92 can be detected while avoiding the pillar portion 91 without having to cause the arm 12 to make go-round motion.

The controller 15 performs the above-described teaching process for each substrate placing portion 92, and stores the height position of each substrate placing portion 92. When the height positions of the respective substrate placing portions 92 are obtained, the height position of the substrate W placed on these substrate placing portions 92 can be determined. Based on the height position of each substrate placing portion 92 and prestored horizontal coordinates of each substrate placing portion 92, the controller 15 determines the height position range of the substrate W supported by the substrate placing portions 92, and stores (teaches) these information as height position information about the substrate W. It should be noted that the height position range of the substrate W herein means a range from the lowermost height position to the uppermost height position of the substrate W. The height position information about the substrate W may contain the orientation of the substrate W (i.e., the tilt of the substrate W relative to the horizontal).

As described above, the substrate transfer apparatus 10 according to the present embodiment includes: a plurality of substrate supports 90 arranged on the same circumference; and the substrate transfer robot 1 including the arm 12, the hand 13 provided on the distal end portion of the arm 12, and the controller 15 configured to control the operation of the arm 12 and the hand 13. Each of the substrate supports 90 includes: the substrate placing portion 92, which includes the upper surface on which the edge of the substrate W is placed; and the pillar portion 91, which supports the substrate placing portion 92 at a position outward of the substrate placing portion 92 in the radial direction of the circumference. The hand 13 includes: the blade 32 whose distal end side is branched into two portions that are the first end portion 321 and the second end portion 322 and between which each substrate support 90 is insertable from the distal end side; the first optical sensor 41 configured to detect an object that blocks the first optical path 41c, the first optical path 41e connecting the first end portion 321 and the second end portion 322 and being orthogonal to the axial direction of the hand 13; and at least one second optical sensor 42 or 43 configured to detect an object that blocks the second optical path 42c or 43c, the second optical path 42c or 43c connecting the first end portion 321 and the second end portion 322 and being inclined relative to the first optical path 41c. The controller 15: selects one optical sensor to use from among the first optical sensor 41 and the at least one second optical sensor 42 or 43; moves the substrate transfer hand to the detection start position P1, at which the optical path of the selected optical sensor is positioned above the substrate placing portion 92 and does not interfere with the pillar portion 91; lowers the hand 13 from the detection start position 91 to the detection position P2, at Which an object is detected by the optical sensor; and stores, as the height position of the substrate placing portion 92, the height of the optical path of the optical sensor from the predetermined positional reference when the hand 13 is at the detection position P2.

Similarly, a method of teaching the substrate transfer robot 1 according to the present embodiment includes: selecting an optical sensor to use from among the first optical sensor 41 and the at least one second optical sensor 42 or 43; moving the hand 13 to the detection start position P1, at which the optical path of the selected optical sensor is positioned above the substrate placing portion 92 and does not interfere with the pillar portion 91; lowering the hand 13 from the detection start position P1 to the detection position P2, at which an object is detected by the optical sensor; and storing, as the height position of the substrate placing portion 92, the height of the optical path of the optical sensor from the predetermined positional reference when the hand 13 is at the detection position P2.

According to the above substrate transfer apparatus 10 and the above method of teaching the substrate transfer robot 1, the height position of the substrate placing portion 92, on which the substrate W is placed, can be taught to the substrate transfer robot by utilizing mapping sensor technology that is adopted in conventional substrate transfer hands. The hand 13 includes a plurality of optical sensors 41 and 42 and/or 43, and utilizes an optical sensor selected from among the plurality of optical sensors 41 and 42 and/or 43. This makes it possible to readily pass only the substrate placing portion 92 across the optical path of the optical sensor while preventing the hand 13 from interfering with the pillar portion 91.

In the substrate transfer apparatus 10 of the above-described embodiment, the hand 13 includes a plurality of second optical sensors 42 and 43 whose optical paths 42c and 43c cross each other.

This makes it possible to perform teaching of the height position of the target substrate placing portion 92 without having to cause the hand 13 and the arm 12 to make unnatural go-round motion.

In the substrate transfer apparatus 10 of the above-described embodiment, the optical sensor to use is selected from among the first optical sensor 41 and the at least one second optical sensor 42 or 43 based on the position of the substrate placing portion 92 relative to the straight line that connects the base axis L1 of the arm 12 and the center of the circumference on which the substrate supports 90 are arranged (i.e., the center O of the substrate handover apparatus 9).

This makes it possible to perform teaching of the height position of the target substrate placing portion 92 without having to cause the hand 13 and the arm 12 to make unnatural go-round motion.

Although the preferred embodiment of the present invention is as described above, specific structural and/or functional details of the above-described embodiment can be modified without departing from the spirit of the present invention, and such modifications fall within the scope of the present invention.

For example, the arm 12 of the substrate transfer robot I according to the above-described embodiment is a horizontal articulated manipulator. However, the arm 12 is not limited to the above-described embodiment. For example, the arm 12 may be an articulated arm of a different type, such as a vertical articulated manipulator, or may be a linear motion telescopic arm. The linear motion telescopic arm is, for example, configured to move the hand 13 by a linear motion driver, such as a ball screw. Generally speaking, compared to articulated arms, linear motion telescopic arms have less degree of freedom for causing the hand 13 to make go-round motion in order to avoid the interference. Therefore, the present invention is more suitably applied to the substrate transfer robot 1 provided with a linear motion telescopic arm and the substrate transfer apparatus 10 including such a substrate transfer robot 1.

The hand 13 of the substrate transfer robot 1 according to the above-described embodiment includes the three optical sensors 41, 42, and 43, However, as an alternative, the hand 13 may include only two optical sensors, or may include four or more optical sensors.

In the substrate transfer robot 1 according to the above-described embodiment, an optical sensor to use is selected from among the first optical sensor 41 and the at least one second optical sensor 42 or 43 based on the position of the target substrate placing portion 92 relative to the straight line that connects the base axis L1 of the arm 12 and the center O of the substrate handover apparatus 9. However, the criterion for the selection of the optical sensor 41, 42, or 43 is not limited to the above example. Instead, each target substrate placing portion 92 and a corresponding one of the optical sensors 41, 42, and 43 to use may be associated with each other in advance, and the operation of the substrate transfer robot 1 may be preprogrammed.

In the substrate transfer robot 1 according to the above-described embodiment, the hand 13 of the substrate transfer robot 1 according to the embodiment includes the three optical sensors 41, 42, and 43. However, in a case where the plurality of substrate supports 90 are not arranged on the same circumference, even if the substrate transfer robot 1 includes only one optical sensor, the height position of the substrate placing portion 92 can be taught to the substrate transfer robot 1 by passing only the substrate placing portion 92 across the optical path of the optical sensor while preventing the hand 13 from interfering with the pillar portion 91.

The substrate transfer apparatus 10 in the above case includes: a plurality of substrate supports 90, each of which includes the substrate placing portion 92 and the pillar portion 91, the substrate placing portion 92 including an upper surface on which the edge of the substrate W is placed, the pillar portion 91 being higher than the substrate placing portion 92; and the substrate transfer robot including the arm 12, the hand 13 rotatably coupled to the arm 12, and the controller 15 configured to control the operation of the arm 12 and the hand 13. The hand 13 includes: the blade 32 whose distal end side is branched into two portions that are the first end portion 321 and the second end portion 322; and the optical sensor (second optical sensor 42 or 43) configured to detect an object that blocks the optical path connecting the first end portion 321 and the second end portion 322. The optical path 42c or 43c of the optical sensor (second optical sensor 42 or 43) is inclined relative to the direction that is orthogonal to the axial direction of the hand 13 when seen in the direction perpendicular to the main surface of the blade 32. The controller 15: moves the hand 13 to the detection start position P1, at which the optical path 42c or 43c of the optical sensor 42 or 43 is positioned above the substrate placing portion 92 and does not interfere with the pillar portion 91; lowers the hand 13 from the detection start position P1 to the detection position P2, at which an object is detected by the optical sensor 42 or 43; and stores, as the height position of the substrate placing portion 92, the height of the optical path 42c or 43c of the optical sensor 42 or 43 from the predetermined positional reference when the hand 13 is at the detection position P2.

REFERENCE SIGNS LIST 1 substrate transfer robot
9 substrate handover apparatus
10 substrate transfer apparatus
11 base
12 robot arm
13 substrate transfer hand
15 controller
20 lifting/lowering shaft
21 first link
22 second link
31 base portion
32 blade
321 first end portion
322 second end portion
33 support pad
34 pusher
40a, 40b sensor support
41, 42 ,43 optical sensor
41c, 42c, 43c optical path
51 control device
60 to 63 drive unit
90 substrate support
91 pillar portion
92 substrate placing portion
A0 to A3 servo driver
E0 to E3 position detector
J1 to J3 joint
L1 base axis
M0 to M3 servomotor
O center (of the substrate handover apparatus)
P1 detection start position
P2 detection position
W substrate

The invention claimed is:
1. A substrate transfer apparatus comprising:
a plurality of substrate supports arranged on a same circumference; and
a substrate transfer robot including an arm, a substrate transfer hand provided on a distal end portion of the arm, and a controller configured to control operation of the arm and the substrate transfer hand, wherein
each of the substrate supports includes:
a substrate placing portion that includes an upper surface on which an edge of a substrate is placed; and
a pillar portion that supports the substrate placing portion at a position outward of the substrate placing portion in a radial direction of the circumference,
the substrate transfer hand includes:
a blade whose distal end side is branched into two portions that are a first end portion and a second end portion and between which each substrate support is insertable from the distal end side;
a first optical sensor configured to detect an object that blocks a first optical path, the first optical path connecting the first end portion and the second end portion and being orthogonal to an axial direction of the substrate transfer hand; and
at least one second optical sensor configured to detect an object that blocks a second optical path, the second optical path connecting the first end portion and the second end portion and being inclined relative to the first optical path, and
the controller:
selects one optical sensor to use from among the first optical sensor and the at least one second optical sensor;
moves the substrate transfer hand to a detection start position at which the optical path of the selected optical sensor is positioned above the substrate placing portion and does not interfere with the pillar portion;
lowers the substrate transfer hand from the detection start position to a detection position at which an object is detected by the optical sensor; and
stores, as a height position of the substrate placing portion, a height of the optical path of the optical sensor from a predetermined positional reference when the substrate transfer hand is at the detection position.

2. The substrate transfer apparatus according to claim 1, wherein
the substrate transfer hand includes a plurality of the second optical sensors whose optical paths cross each other.

3. The substrate transfer apparatus according to claim 1, wherein
the controller selects the optical sensor to use from among the first optical sensor and the at least one second optical sensor based on a position of the substrate placing portion relative to a straight line that connects a base axis of the arm and a center of the circumference.

4. A method of teaching a substrate transfer robot, which is a method of teaching height positions of a plurality of substrate placing portions arranged on a same circumference to a substrate transfer robot that includes an arm and a substrate transfer hand provided on a distal end portion of the arm, wherein
each of the substrate placing portions includes an upper surface on which an edge of a substrate is placed, and is supported by a pillar portion at a position outward of the substrate placing portion in a radial direction of the circumference, and
the substrate transfer hand includes:
a blade whose distal end side is branded into two portions that are a first end portion and a second end portion and between which each substrate placing portion is insertable from the distal end side;
a first optical sensor configured to detect an object that blocks a first optical path, the first optical path connecting the first end portion and the second end portion and being orthogonal to an axial direction of the substrate transfer hand; and
at least one second optical sensor configured to detect an object that blocks a second optical path, the second optical path connecting the first end portion and the second end portion and being inclined relative to the first optical path,
the method comprising:
selecting an optical sensor to use from among the first optical sensor and the at least one second optical sensor;
moving the substrate transfer hand to a detection start position at which the optical path of the selected optical sensor is positioned above the substrate placing portion and does not interfere with the pillar portion;
lowering the substrate transfer hand from the detection start position to a detection position at which an object is detected by the optical sensor; and
storing, as a height position of the substrate placing portion, a height of the optical path of the optical sensor from a predetermined positional reference when the substrate transfer hand is at the detection position.

5. The method of teaching a substrate transfer robot according to claim 4, comprising selecting the optical sensor to use from among the first optical sensor and the at least one second optical sensor based on a position of the substrate placing portion relative to a straight line that connects a base axis of the arm and a center of the circumference.

6. A substrate transfer apparatus comprising:
a plurality of substrate supports, each of which includes a substrate placing portion and a pillar portion, the substrate placing portion including an upper surface on which an edge of a substrate is placed, the pillar portion being higher than the substrate placing portion; and
a substrate transfer robot including an arm, a substrate transfer hand rotatably coupled to the arm, and a controller configured to control operation of the arm and the substrate transfer hand, wherein
the substrate transfer hand includes:
a blade whose distal end side is branched into two portions that are a first end portion and a second end portion; and
an optical sensor configured to detect an object that blocks an optical path connecting the first end portion and the second end portion,
the optical path is inclined relative to a direction that is orthogonal to an axial direction of the substrate transfer hand when seen in a direction perpendicular to a main surface of the blade, and
the controller:
moves the substrate transfer hand to a detection start position at which the optical path of the optical sensor is positioned above the substrate placing portion and does not interfere with the pillar portion;
lowers the substrate transfer hand from the detection start position to a detection position at which an object is detected by the optical sensor; and
stores, as a height position of the substrate placing portion, a height of the optical path of the optical sensor from a predetermined positional reference when the substrate transfer hand is at the detection position.

* * * * *